(12) United States Patent
Miyazaki

(10) Patent No.: US 10,253,427 B2
(45) Date of Patent: Apr. 9, 2019

(54) EPITAXIAL GROWTH APPARATUS AND METHOD OF MANUFACTURING A SEMICONDUCTOR DEVICE

(71) Applicant: Toshiba Memory Corporation, Minato-ku (JP)

(72) Inventor: Shinji Miyazaki, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/239,190

(22) Filed: Aug. 17, 2016

(65) Prior Publication Data
US 2017/0287701 A1    Oct. 5, 2017

(30) Foreign Application Priority Data

Mar. 31, 2016   (JP) .................................. 2016-071214

(51) Int. Cl.
| | | |
|---|---|---|
| *C30B 25/14* | (2006.01) | |
| *C23C 16/44* | (2006.01) | |
| *C23C 16/455* | (2006.01) | |

(52) U.S. Cl.
CPC .......... *C30B 25/14* (2013.01); *C23C 16/4412* (2013.01); *C23C 16/455* (2013.01)

(58) Field of Classification Search
CPC combination set(s) only.
See application file for complete search history.

(56) References Cited

U.S. PATENT DOCUMENTS

| | | | |
|---|---|---|---|
| 6,019,839 A * | 2/2000 | Achutharaman | C30B 25/02 117/104 |
| 8,597,429 B2 | 12/2013 | Suzuki et al. | |
| 2001/0050053 A1* | 12/2001 | Umotoy | B01D 8/00 118/715 |
| 2002/0106909 A1 | 8/2002 | Kato et al. | |
| 2004/0112056 A1* | 6/2004 | Olander | B01D 53/002 60/643 |
| 2005/0081789 A1 | 4/2005 | Kato et al. | |
| 2006/0144234 A1* | 7/2006 | Komatsu | C23C 16/4412 95/288 |
| 2008/0047578 A1* | 2/2008 | Yoo | B08B 7/0035 134/1.1 |

(Continued)

FOREIGN PATENT DOCUMENTS

| | | |
|---|---|---|
| JP | 2001-259357 A | 9/2001 |
| JP | 2001-284264 | 10/2001 |
| JP | 2002-334869 A | 11/2002 |

(Continued)

OTHER PUBLICATIONS

Office Action dated Nov. 20, 2018 in corresponding Japanese Patent Application No. 2016-071214 with English machine translation.

*Primary Examiner* — Duy Vu N Deo
*Assistant Examiner* — Erin F Bergner
(74) *Attorney, Agent, or Firm* — Oblon, McClelland, Maier & Neustadt, L.L.P.

(57) ABSTRACT

According to one embodiment, an epitaxial growth apparatus includes a processing chamber, an exhaust pipe, and an introducing pipe. The exhaust pipe is communicated with the processing chamber. The introducing pipe is communicated with the exhaust pipe and an alkaline gas is introduced into the exhaust pipe via the introducing pipe.

16 Claims, 5 Drawing Sheets

(56) References Cited

U.S. PATENT DOCUMENTS

2009/0214785 A1* 8/2009 Arena .................. C23C 16/303
                                                    427/255.28
2015/0140835 A1* 5/2015 Tateno .................. C23C 16/52
                                                    438/773

FOREIGN PATENT DOCUMENTS

| JP | 2005-225756 | A | 8/2005 |
| JP | 2005-340283 | A | 12/2005 |
| JP | 2011-035047 | A | 2/2011 |
| JP | 2012-164977 | | 8/2012 |
| JP | 2012-169543 | | 9/2012 |
| JP | 2013-058660 | A | 3/2013 |
| WO | WO-2014021220 A1 * | 2/2014 | ............. C23C 16/52 |

* cited by examiner

US 10,253,427 B2

EPITAXIAL GROWTH APPARATUS AND METHOD OF MANUFACTURING A SEMICONDUCTOR DEVICE

CROSS-REFERENCE TO RELATED APPLICATION

This application is based upon and claims the benefit of priority from Japanese Patent Application No. 2016-71214, filed Mar. 31, 2016, the entire contents of which are incorporated herein by reference.

FIELD

Embodiments described herein relate generally to an epitaxial growth apparatus and a method of manufacturing a semiconductor device.

BACKGROUND

In an epitaxial growth apparatus, a processing gas for the epitaxial growth is supplied to a processing chamber and discharged from the processing chamber via an exhaust pipe. In this art, it is desired to improve a maintenance property of the epitaxial growth apparatus.

DETAILED DESCRIPTION

Figure 1:
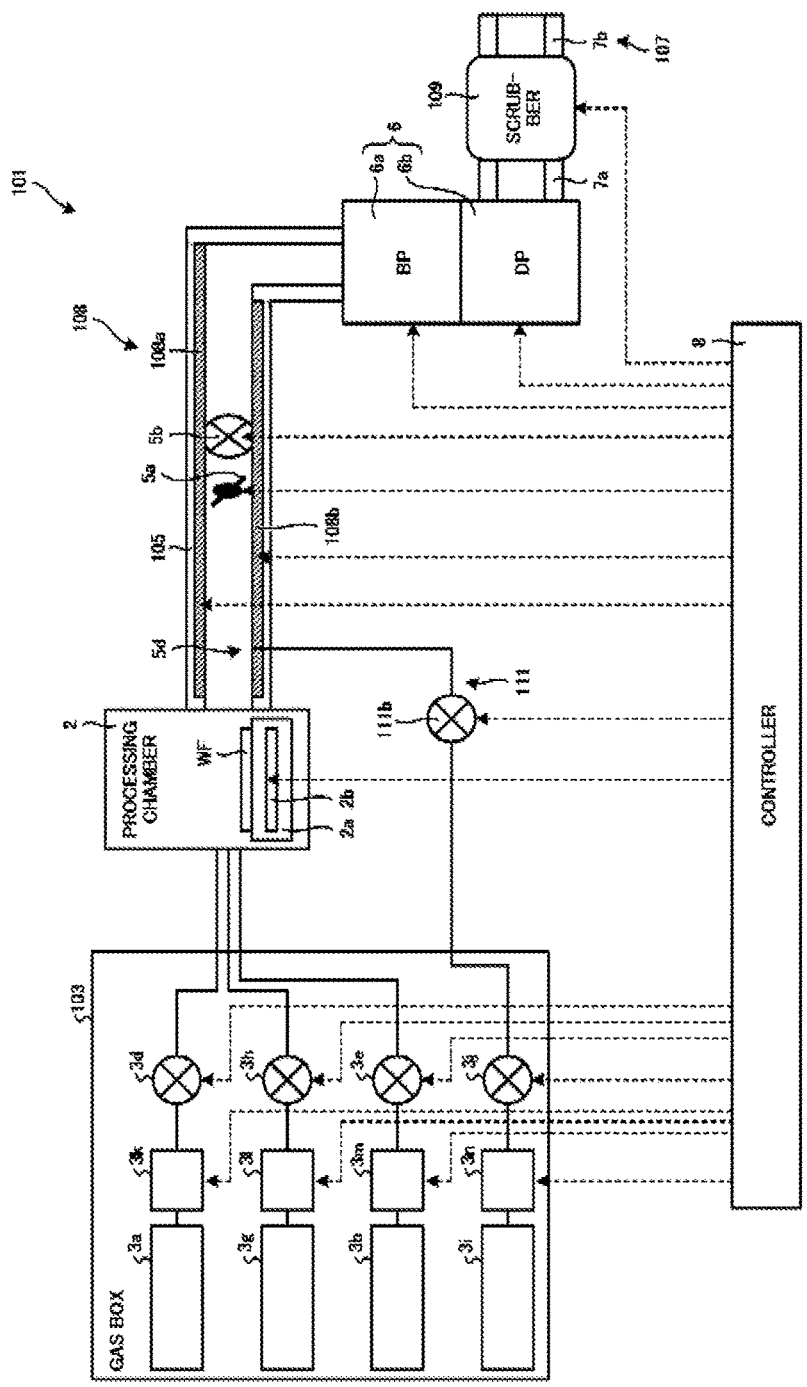
FIG. 1 is a diagram showing a configuration of an epitaxial growth apparatus according to an embodiment.

In general, according to one embodiment, an epitaxial growth apparatus includes a processing chamber, an exhaust pipe, and an introducing pipe. The exhaust pipe is communicated with the processing chamber. The introducing pipe is communicated with the exhaust pipe and an alkaline gas is introduced into the exhaust pipe via the introducing pipe.

Exemplary embodiments of an epitaxial growth apparatus will be explained below in detail with reference to the accompanying drawings. In the drawings, the same reference numerals are attached to the same elements and duplicate explanations of the elements will not be repeated for brevity. The present invention is not limited to the following embodiments.

FIG. 1 is a diagram showing a configuration of the epitaxial growth apparatus 101 according to the embodiment. The epitaxial growth apparatus 101 forms an epitaxial growth layer on a substrate WF by a CVD (chemical vapor deposition) method. The epitaxial growth apparatus 101 includes a processing chamber 2, a gas box 103, an exhaust pipe 105, a vacuum unit 6, an exhaust pipe 107, and a controller 8.

The processing chamber 2 includes a space surrounded by wall portions and the space can be depressurized to a vacuum state. For the processing chamber 2, various kinds of concrete configurations can be applicable. For example, an epitaxial growth furnace equipped with a vertical vapor deposition reactor furnace can be applicable. In addition, a cylindrical epitaxial growth furnace where substrates are placed on a truncated polygonal pyramid shape susceptor, or a single-wafer type epitaxial growth furnace where a single substrate is placed on a disc-shaped substrate holder may be applied.

Figure 2:
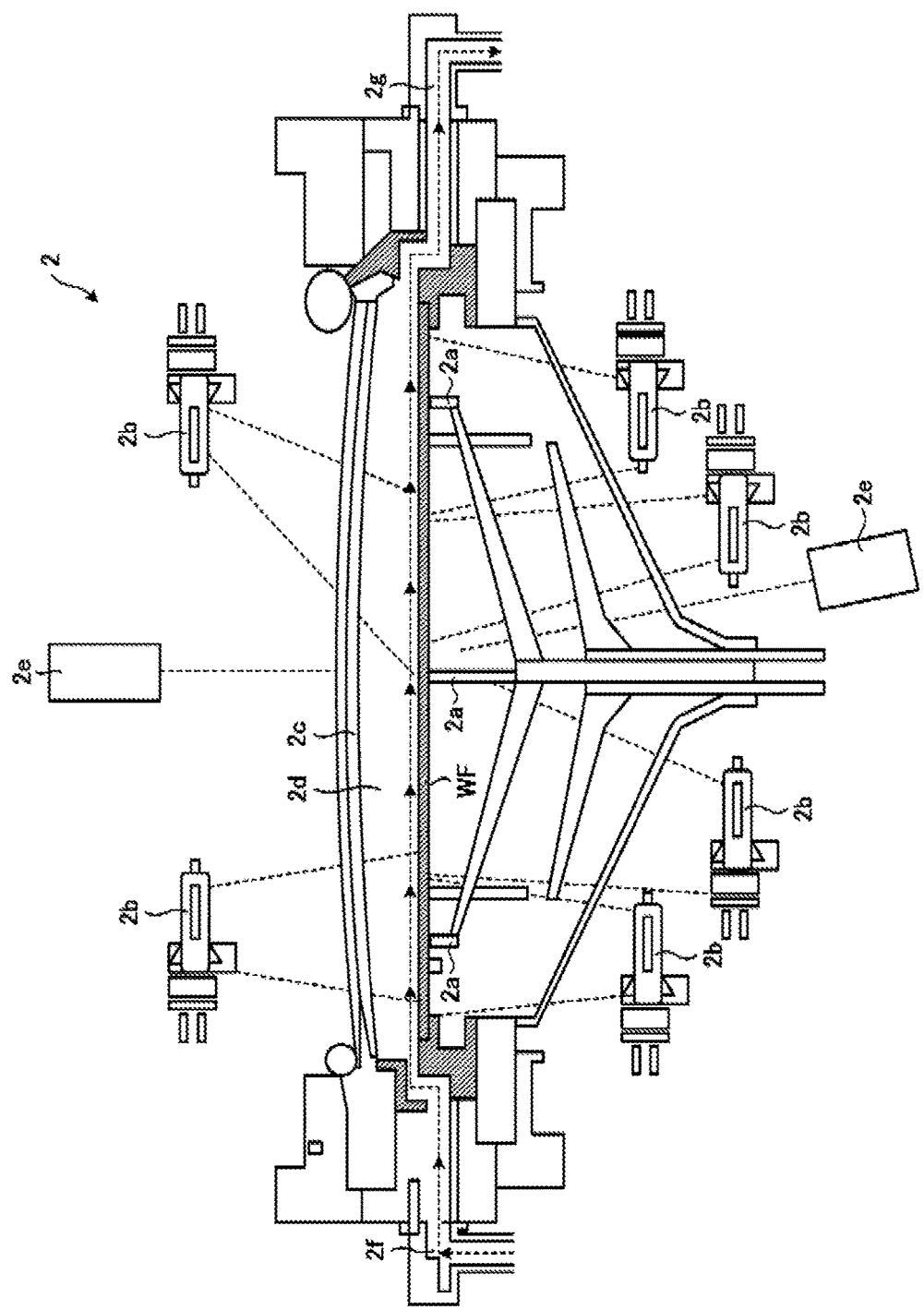
FIG. 2 is a diagram showing a configuration of a processing chamber according to the embodiment.

The processing chamber 2 may be configured as shown in FIG. 2, for example, in case of applying the single-wafer type epitaxial growth furnace. FIG. 2 is a diagram showing the configuration of the processing chamber 2. The processing chamber 2 contains supporting members 2a, heating lamps 2b, an upper dome 2c, a processing space 2d, a pyrometer 2e, a supply port 2f, and an exhaust port 2g. The processing space 2d is communicated via the supply port 2f with supply valves 3d, 3h, and 3e (see FIG. 1) and communicated via the exhaust port 2g with the exhaust pipe 105 (see FIG. 1). The supporting members 2a can support the substrate WF placed on the supporting members 2a. The heating lamps 2b heat the substrate WF placed on the supporting members 2a. At least one of the heating lamps 2b may be provided both of on a front surface side and a rear surface side of the substrate WF respectively. The pyrometer 2e is disposed in a position capable of measuring a temperature of the substrate WF suitably.

The controller 8, for example, sets the processing space 2d at an atmospheric pressure or a reduced pressure when the substrate WF is placed on the supporting members 2a in the processing space 2d. The processing space 2d is communicated with the vacuum unit 6 via the exhaust pipe 105. The vacuum unit 6 is disposed between the exhaust pipe 105 and the exhaust pipe 107 on a downstream side and includes a booster pump (BP) 6a and a dry pump (DP) 6b. In the exhaust pipe 105, an APC (Automatic Pressure Controller) valve 5a and a gate valve 5b are provided. The controller 8 operates the vacuum unit 6 (BP 6a and DP 6b) to exhaust inside the processing space 2d via the exhaust pipe 105 and simultaneously controls degree of openness of the APC valve 5a such that a pressure in the processing space 2d becomes a target value while maintaining the APC valve 5a in an open state.

Further, the controller 8 controls the supply valves 3d, 3h, and 3e in an open state and causes the gas box 103 to supply the processing space 2d with a processing gas via the supply valves 3d, 3h, and 3e while causing the heating lamps 2b to heat the substrate WF. In heating the substrate WF, the controller 8 controls power of the heating lamps 2b such that the surface temperature of the substrate WF measured by the pyrometer 2e becomes a range of 800° C. to 1200° C., for example. The processing gas includes a raw material gas having reactivity, a carrier gas and an acidic gas for selective film formation and for surface cleaning. The gas box 103 includes a row material gas supply source 3a, a carrier gas supply source 3g, an acidic gas supply source 3b, the supply valves 3d, 3h, and 3e, and mass flow controllers 3k, 3l, and 3m. The mass flow controllers 3k, 3l, and 3m are provided between the row material gas supply source 3a, the carrier gas supply source 3g and the acidic gas supply source 3b and the supply valves 3d, 3h, and 3e respectively. The controller 8 controls, utilizing the mass flow controllers 3k, 3l, and 3m, flow rates of the row material gas, the carrier gas and the acidic gas supplied from the row material gas supply source 3a, the carrier gas supply source 3g and the acidic gas supply source 3b to the supply valves 3d, 3h, and 3e. Thus, the row material gas, the carrier gas and the acidic gas are supplied from the row material gas supply source 3a, the carrier gas supply source 3g and the acidic gas supply source 3b to the processing space 2d at predetermined flow rates respectively.

The row material gas serves a material for forming the epitaxial growth layer on the substrate WF. For example, when the epitaxial growth layer of silicon (Si) is formed, the row material gas includes silane-based gas. Silane-based gas includes SiH2Cl2 (dichlorosilane, hereinafter referred as DCS) gas, SiHCl3 (trichlorosilane, hereinafter referred as TCS) gas and the like. The carrier gas is used for keeping a mixing state in the processing space 2d and includes H2 (hydrogen) gas, for example. The acidic gas serves a cleaning gas for the surface of the substrate WF and includes, for example, HCl (hydrogen chloride) gas and the like. The acidic gas is supplied together with the row material gas over the substrate WF to improve selectivity of the epitaxial growth in forming the epitaxial growth layer. Namely, in forming the epitaxial growth layer on the substrate WF, an undesirable substance is likely to form or adhere to the surface of the substrate WF and the epitaxial growth on the substrate WF may be prevented by the undesirable substance. An addition of the acidic gas with the row material gas, however, makes the substrate surface in a cleaned state when it is exposed to the row material gas, and as a result, a favorable epitaxial growth on the cleaned surface of the substrate WF can be realized.

For example, in the case where the row material gas is DC gas, by heating the substrate WF to a temperature range between 800° C. and 1200° C., a reaction expressed by formula (1) given below progresses and the epitaxial growth layer of silicon (Si) is formed on the substrate WF.

$$\text{SiH2Cl2} \rightarrow \text{Si (monocrystal)} + 2\text{HCl}\uparrow \tag{1}$$

Since residence time of the processing gas is short in the processing space 2d, most of the processing gas is likely to discharge toward the vacuum unit 6 via the exhaust pipe 105 and on inner surfaces of the exhaust pipe 105, unintended silane-based substances called oily silane OS sometimes deposit. The oily silane OS may be constituted by a shell of solid (particle state) at its outer portion and a substance of gel (liquid) at its inner portion. And the oily silane OS may include by-products generated by a chemical reaction and the like of the row material gas that has not been consumed to the intended film-formation reaction and remains in the exhaust pipe 105 with another gas. Or, the oily silane OS is exemplified by reaction products between the row material gas and the acidic gas. The oily silane OS is generated, for example, by reactions expressed by formulae (2) to (4) given below in a location where temperature of the gases discharged from the processing space 2d falls (for example, about 400° C.) in the exhaust pipe 105 after the temperature of the gases has risen in the processing space 2d. The oily silane OS, namely, may include polymers such as polymerized products of SixCly, SixHz, SixClyHz and the like shown in formulae (2) to (4). In formulae (2) to (4), k1 to k4 each indicates a certain coefficient.

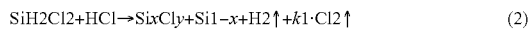

$$\text{SiH2Cl2} + \text{HCl} \rightarrow \text{SixCly} + \text{Si1-x} + \text{H2}\uparrow + k1 \cdot \text{Cl2}\uparrow \tag{2}$$

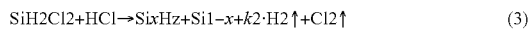

$$\text{SiH2Cl2} + \text{HCl} \rightarrow \text{SixHz} + \text{Si1-x} + k2 \cdot \text{H2}\uparrow + \text{Cl2}\uparrow \tag{3}$$

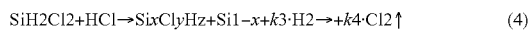

$$\text{SiH2Cl2} + \text{HCl} \rightarrow \text{SixClyHz} + \text{Si1-x} + k3 \cdot \text{H2} \rightarrow + k4 \cdot \text{Cl2}\uparrow \tag{4}$$

The oily silane OS, i.e. polymer compounds of SixCly, SixHz, SixClyHz, is a substance having a high reactivity with a water vapor in the atmosphere and the like, so it needs to be handled carefully in terms of chemical safety. It should be noted that the oily silane OS exposed to the atmosphere tends to violently react with the atmosphere and cause a fire, burning, an explosion and the like.

The oily silane OS may generate closing of the exhaust pipe 105 by depositing on the inner surfaces of the exhaust pipe 105. Suppose a maintenance of the epitaxial growth apparatus 101 is performed to prevent the closing of the exhaust pipe 105, especially performed is a cleaning maintenance of the exhaust pipe 105 to remove the deposited oily silane OS by oxidizing and decomposing the oily silane OS. For example, an oxidizing gas is supplied from the gas box 103 via the processing space 2d to the exhaust pipe 105 after the formation of the epitaxial growth layer in the processing chamber 2 is completed. In this case, the gas box 103 further includes an oxidizing gas supply source (not shown), a mass flow controller for the oxidizing gas (not shown), and a supply valve for the oxidizing gas (not shown). The controller 8 makes the supply valve for the oxidizing gas in an open state and controls the mass flow controller for the oxidizing gas to adjust a flow rate of the oxidizing gas while maintaining the supply valves 3d, 3h, and 3e in a close state. Thus, the oxidizing gas supply source supplies the oxidizing gas to the exhaust pipe 105 via the processing space 2d at a predetermined flow rate. The oxidizing gas includes, as the cleaning gas for the exhaust pipe 105, ClF3 (trichlorofluorine) for example. In this way, assuming that a reaction expressed by formula (5) given below progresses sufficiently, it is expected that the cleaning maintenance of the exhaust pipe 105 can be performed without being exposed to the atmosphere by gasifying the oily silane OS in the exhaust pipe 105. In formula (5), k5 to k8 each indicates a certain coefficient.

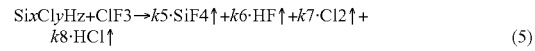

$$\text{SixClyHz} + \text{ClF3} \rightarrow k5 \cdot \text{SiF4}\uparrow + k6 \cdot \text{HF}\uparrow + k7 \cdot \text{Cl2}\uparrow + k8 \cdot \text{HCl}\uparrow \tag{5}$$

However, the reaction expressed by formula (5) is likely to generate only on a surface side (at the outer shell portion of solid) of the oily silane OS adhered to the inner surfaces of the exhaust pipe 105 in contact with the oxidizing gas (ClF3). Accordingly, the exhaust pipe 105 is required to be supplied with the expensive oxidizing gas (ClF3) continuously for a long time to remove the oily silane OS fully. As a result, since the cleaning maintenance of the exhaust pipe 105 tends to become long and costly, the operating rate of the epitaxial growth apparatus 101 depending on maintenance property is extremely reduced.

In addition, even if the oxidizing gas (ClF3) is supplied continuously for a long time, a large amount of the oily silane OS may fail to be removed and remain adhered to the inner surfaces of the exhaust pipe 105. In such a case, the maintenance of the epitaxial growth apparatus 101 accompanied with exposure to the atmosphere, i.e. the cleaning maintenance of the exhaust pipe 105 in a diassembled state is still required. So, it may take a much longer time for the cleaning maintenance of the exhaust pipe 105.

Moreover, when the exhaust pipe 105 is diassembled for the cleaning maintenance to be exposed to the atmosphere, the reaction expressed by formula (5) may cause an explosively violent phenomenon in the presence of the atmosphere in addition to the explosion of the oily silane OS itself by reacting with the atmosphere. Accordingly, safety in the cleaning maintenance of the exhaust pipe 105 should be concerned and in this respect the maintenance property of the epitaxial growth apparatus 101 is likely to further deteriorate.

In this embodiment, let both of the raw material gas (DCS gas) and the acidic gas (HCl) react with an alkaline gas (NH3 gas) in the exhaust pipe 105. The products (NH4Cl)

are capable of gasifying and discharging from the exhaust pipe 105, so improvement of the maintenance property of the epitaxial growth apparatus 101 can be realized in this embodiment.

Specifically, the epitaxial growth apparatus 101 further includes an introducing pipe 111, a heater unit 108, and a scrubber 109 as illustrated in FIG. 1.

The introducing pipe 111 is communicated with the exhaust pipe 105. For example, a supply port 5d is disposed on an upstream side of the exhaust pipe 105 and the introducing pipe 111 is coupled to the supply port 5d. Therefore, the introducing pipe 111 is communicated with the upstream side portion (a portion on the processing chamber 2 side) of the exhaust pipe 105. In the introducing pipe 111, a gate valve 111b is inserted.

The introducing pipe 111 is disposed between the gas box 103 and the exhaust pipe 105 without inserting the processing space 2d into a gas flow channel via the introducing pipe 111. In other words, the introducing pipe 111 communicates a part of the gas box 103 (an alkaline gas supply source 3i, a mass flow controller 3n, and a supply valve 3j) with the exhaust pipe 105 while bypassing the processing space 2d.

The heater unit 108 heats the exhaust pipe 105. The heater unit 108 is configured to heat at least the inner surfaces of the exhaust pipe 105. The heater unit 108 includes heaters 108a and 108b. The heaters 108a and 108b, for example, are aligned to a longitudinal direction of the exhaust pipe 105 in contact with walls of the exhaust pipe 105. Or the heaters 108a and 108b aligned to the longitudinal direction of the exhaust pipe 105, for example, may be enclosed in the walls of the exhaust pipe 105 on the inner surface side. In addition, a heat insulating material (not shown) may be disposed outside the heaters 108a and 108b heating the exhaust pipe 105 or outside the exhaust pipe 10. In this way, the heater unit 108 can heat the gases passing in the exhaust pipe 105 directly or by heat conduction through the exhaust pipe 105. The controller 8 controls powers of the heaters 108a and 108b such that the temperature of the inner surfaces of the exhaust pipe 105 becomes a range of 200° C. to 400° C. (200° C. or more and 400° C. or less), for example.

The gas box 103 further includes the alkaline gas supply source 3i, the mass flow controller 3n, and the supply valve 3j. The introducing pipe 111 may be communicated with the alkaline gas supply source 3i via the mass flow controller 3n and the supply valve 3j. The mass flow controller 3n is disposed between the alkaline gas supply source 3i and the supply valve 3j. The alkaline gas from the alkaline gas supply source 3i passes through the mass flow controller 3n, the supply valve 3j, and the introducing pipe 111 and is introduced at a flow rate controlled by the mass flow controller 3n into the exhaust pipe 105 where the processing gas is discharged from the processing chamber 2. The processing gas in the exhaust pipe 105 may be cooled after heated to a high temperature in the processing space 2d. The alkaline gas is used for the purpose of the reaction with the processing gas whose temperature falls (lower than 400° C., for example) and includes, for example, an ammonia (NH3) gas. The alkaline gas from the alkaline gas supply source 3i is introduced into the exhaust pipe 105 passing through the mass flow controller 3n, the supply valve 3j, and the introducing pipe 111 but without passing through the processing chamber 2 when the supply valve 3j and the gate valve 111b are in open states.

For example, in the case where NH3 gas is introduced into the exhaust pipe 105 as the alkaline gas, reactions expressed by formulae (6) and (7) given below progresses between the NH3 gas and the processing gas (DCS gas and HCl gas) and the reaction product (NH4Cl) gasifies by heating the exhaust pipe 105 to a temperature of 200° C. or more and 400° C. or less.

$$SiH2Cl2 + 2NH3 \rightarrow Si + 2NH4Cl\uparrow \qquad (6)$$

$$HCl + NH3 \rightarrow NH4Cl\uparrow \qquad (7)$$

NH3 gas has high reactivity with each of DCS gas (SiH2Cl2) and HCl gas and the reaction product (NH4Cl) in formulae (6) and (7) can be generated easily. Further, in formula (6) Si (fine particles) are formed as an intermediate product and can be discharged from the exhaust pipe 105 together with a gas ingredient, i.e. the gasified reaction product.

In this way, the oily silane OS can be prevented from being generated since the reactions expressed by formulae (6) and (7) progresses before the reactions expressed by formulae (2) to (4) starts. The reaction product (NH4Cl) in formulae (6) and (7) is capable of gasifying by heating and can be easily handled as compared to the oily silane OS. When heating the exhaust pipe 105 to the temperature of 200° C. or more and 400° C. or less specifically, gasification of the reaction product (NH4Cl) enables the reaction product and the other substances (Si fine particles) to be discharged from the exhaust pipe 105 not to deposit in the exhaust pipe 105. Accordingly, the cleaning maintenance without disassembling the exhaust pipe 105 can be integrated into an in-line processing.

Note that the reaction product is less likely to gasify in the case where the temperature of the exhaust pipe 105 is lower than 200° C., and the reaction product may remain in the exhaust pipe 105 and close the exhaust pipe 105. To the contrary when the temperature of the exhaust pipe 105 is higher than 400° C., since a certain unintended film (a silicon nitride film, for example) can deposit on the inner surfaces of the exhaust pipe 105 based on a reaction expressed by formula (8) given below, the depositing film may close the exhaust pipe 105.

$$3SiH2Cl2 + 4NH3 \rightarrow Si3N4 + 6HCl\uparrow + 6H2 \qquad (8)$$

In the case where the alkaline gas from the alkaline gas supply source 3i is introduced into the exhaust pipe 105 passing through the processing chamber 2, since the certain unintended film (a silicon nitride film, for example) can deposit on the substrate WF based on the reaction expressed by formula (8), the formation of the epitaxial growth layer on the substrate WF may be prevented by the depositing film.

It is desired to detoxify the gasified reaction product (NH4Cl) and the other substances (Si fine particles) before discharged to the outside via the exhaust pipe 105 and the vacuum unit 6. For the purpose of detoxifying, the scrubber 109 is inserted between an upstream side part 7a and a downstream part 7b of the exhaust pipe 107 and the reaction product is dissolved in a liquid and removed from the discharging gas in the scrubber 109.

In more detail, in the scrubber 109 supplied with discharging gas including the reaction product (NH4Cl) and the other substances (Si fine particles) via the exhaust pipe 105, the vacuum unit 6, and the upstream side part 7a of the exhaust pipe 107, the discharging gas comes into contact with the liquid in which the reaction product is soluble (water, for example) and the reaction product is taken in the liquid and removed from the discharging gas. Further in the scrubber 109, the other substances (Si fine particles) are removed by adhering to a filter after reacting with the liquid (water, for example) and being changed to an oxide (SiO2).

As a concrete configuration of the scrubber 109, a jet scrubber which sprays the liquid to the discharging gas or a wet scrubber in which the discharging gas passes through the liquid can be applicable, for example.

Figure 3:
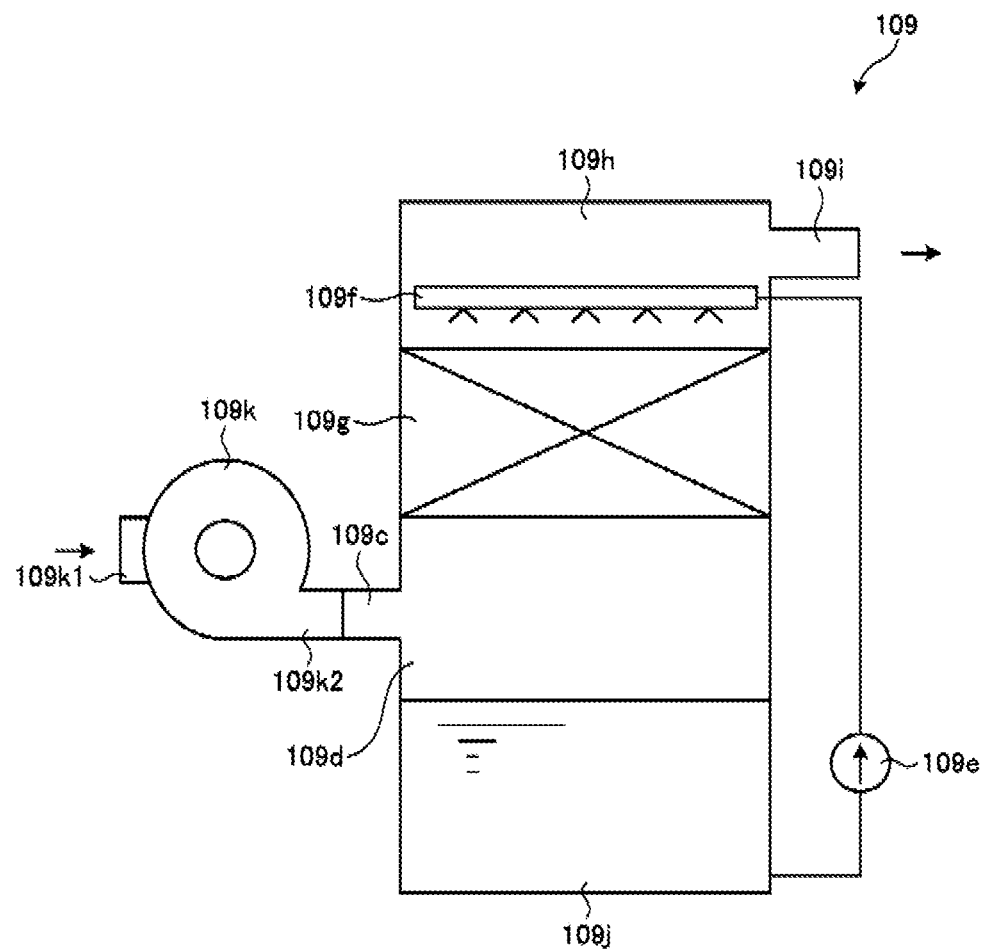
FIG. 3 is a diagram showing a configuration of a scrubber according to the embodiment.

The scrubber 109 may be configured as shown in FIG. 3, in case of applying the wet scrubber. FIG. 3 is a diagram showing a configuration of the scrubber 109.

The scrubber 109 includes a fan 109$k$, an inlet pipe 109$c$, a cleaning liquid pool 109$j$, an upstream side scrubber section 109$d$, a filter 109$g$, a cleaning liquid pump 109$e$, a shower nozzle 109$f$, a downstream side scrubber section 109$h$, and an outlet pipe 109$i$. The fan 109$k$ causes the discharging gas introduced from an inlet port 109$k$1 communicating with the upstream side part 7$a$ of the exhaust pipe 107 to blow via an outlet port 109$k$2 communicating with the inlet pipe 109$c$. The discharging gas blown from the fan 109$k$ is introduced into the upstream side scrubber section 109$d$ via the inlet pipe 109$c$.

The cleaning liquid pool 109$j$ is storing the liquid in which the reaction product is soluble, i.e. the cleaning liquid (pure water, for example). The cleaning liquid pump 109$e$ pumps up the cleaning liquid stored in the cleaning liquid pool 109$j$ and supplies it to the shower nozzle 109$f$. The shower nozzle 109$f$ injects the cleaning liquid toward the filter 109$g$ and impregnates it into the filter 109$g$. The filter 109$g$ can be made of porous cloth, fiber fabric and the like. When the discharging gas introduced into the upstream side scrubber section 109$d$ passes through openings in the filter 109$g$, the reaction product included in the discharging gas can be dissolved in the cleaning liquid since the discharging gas comes into contact with the cleaning liquid impregnated into the filter 109$g$. Simultaneously, the other substances (Si fine particles) in the discharging gas and in contact with the cleaning liquid are changed to the oxide, and subsequently the oxide can be removed by adhering to the filter 109$g$. After the reaction product and the other substances have been removed from the discharging gas in this way, the discharging gas is introduced into the downstream side scrubber section 109$h$ and discharged to the downstream part 7$b$ of the exhaust pipe 107 via the outlet pipe 109$i$.

Figure 4:
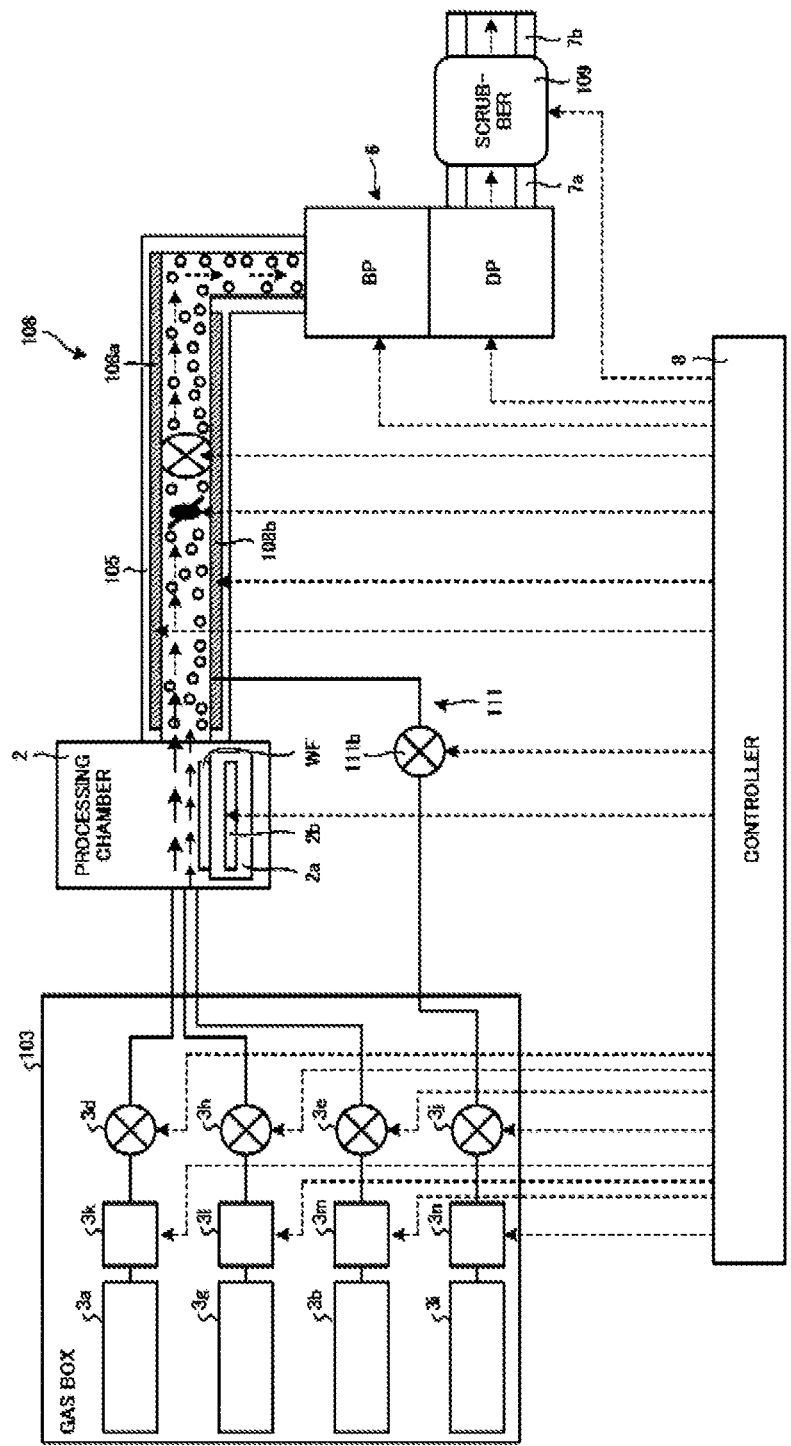
FIG. 4 is a diagram showing an operation of the epitaxial growth apparatus according to the embodiment.
Figure 5:
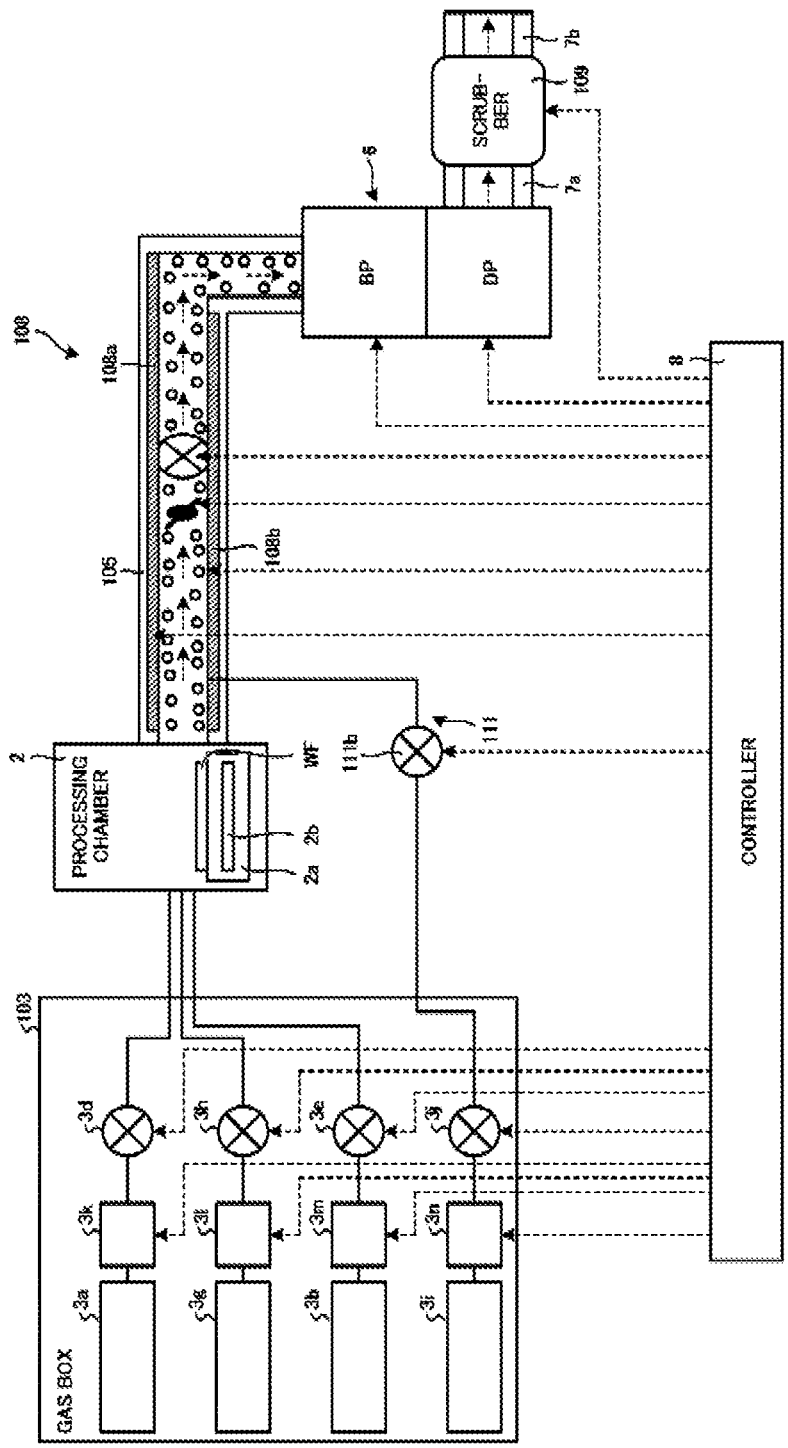
FIG. 5 is a diagram showing an operation of the epitaxial growth apparatus according to the embodiment.

Next, the following describes an operation of the epitaxial growth apparatus 101 with reference to FIG. 1, FIG. 4, and FIG. 5. FIG. 4 and FIG. 5 are diagrams showing an operation of the epitaxial growth apparatus 101 respectively. FIG. 1 shows the configuration of the epitaxial growth apparatus 101 and is utilized also for describing the operation of the epitaxial growth apparatus 101 hereinafter.

As shown in FIG. 1, the controller 8, based on a processing schedule information and a recipe information of the epitaxial growth apparatus 101, makes the gate valve 111$b$ in an open state to introduce the alkaline gas into the exhaust pipe 105 and causes the heater unit 108 to start heating of the exhaust pipe 105 a first time-lag before the start timing of the epitaxial growth layer formation. The controller 8, for example, controls a flow rate of the mass flow controller 3$n$ at a predetermined value and, to communicate the alkaline gas supply source 3$i$ via the introducing pipe 111 with the exhaust pipe 105, makes the supply valve 3$j$ in an open state while maintaining the supply valves 3$d$, 3$h$, and 3$e$ in a close state. Thus, the alkaline gas is supplied to the exhaust pipe 105 at a flow rate controlled by the mass flow controller 3$n$. The first time-lag can be set experimentally in advance so as to fill the exhaust pipe 105 with the alkaline gas and stabilize the temperature of the exhaust pipe 105 at a target value (for example 200° C. to 400° C.).

At the start timing of the epitaxial growth layer formation, the controller 8 controls flow rates of the mass flow controllers 3$k$, 3$l$, and 3$m$ at predetermined values respectively and makes the supply valves 3$d$, 3$h$, and 3$e$ in an open state as shown in FIG. 4. As a result, the row material gas, the carrier gas and the acidic gas are supplied from the row material gas supply source 3$a$, the carrier gas supply source 3$g$ and the acidic gas supply source 3$b$ to the processing space 2$d$ at respective predetermined flow rates. The substrate WF is heated and the controller 8 controls power of the heating lamps 2$b$ such that the surface temperature of the substrate WF measured by the pyrometer 2$e$ becomes a range of 800° C. to 1200° C., for example. Here, the epitaxial growth layer of silicon (Si) is formed on the substrate WF based on, for example, the reaction expressed by formula (1).

At this time, the controller 8 controls the operation such that the alkaline gas supply source 3$i$ is communicated continuously via the introducing pipe 111 with the exhaust pipe 105 and continues unintermitted introducing of the alkaline gas into the exhaust pipe 105 at a flow rate controlled by the mass flow controller 3$n$. As a result, since the reactions expressed by formulae (6) and (7) progress in the exhaust pipe 105, the oily silane OS can be prevented from being generated. In FIG. 4, fine open circles show the reaction product (NH4Cl) and the other substances (Si fine particles) generated by the reactions expressed by formulae (6) and (7). Further, the controller 8 makes the heater unit 108 to continue heating of the exhaust pipe 105. This heating causes the reaction product generated by the reactions expressed by formulae (6) and (7) to gasify, so the reaction product and the other substances (Si fine particles) are enabled to be discharged from the exhaust pipe 105 (See dashed arrows in FIG. 4). Accordingly, the cleaning maintenance without diassembling the exhaust pipe 105 can be integrated into an in-line processing. The discharging gas including the gasified reaction product and the other substances is supplied to the scrubber 109 via the exhaust pipe 105, the vacuum unit 6, and the upstream side part 7$a$ of the exhaust pipe 107 and detoxified in the scrubber 109. The detoxified discharging gas in which the reaction product and the other substances have been removed is discharged to the outside via the downstream part 7$b$ of the exhaust pipe 107.

At the termination timing of the epitaxial growth layer formation, the controller 8 makes the supply valves 3$d$, 3$h$, and 3$e$ in a close state to stop supply of the processing gas to the processing space 2$d$.

The controller 8 controls the operation such that the alkaline gas supply source 3$i$ is communicated continuously via the introducing pipe 111 with the exhaust pipe 105 and continues unintermitted introducing of the alkaline gas into the exhaust pipe 105 at a flow rate controlled by the mass flow controller 3$n$ during a second time-lag after the termination timing of the epitaxial growth layer formation. It causes to progress the reactions expressed by formulae (6) and (7) and enables the gasified reaction product and the other substances to be discharged with regard to the gases remaining in the exhaust pipe 105 after the termination of the epitaxial growth layer formation (See dashed arrows in FIG. 5). The second time-lag can be set experimentally in advance so as to progress the reactions expressed by formulae (6) and (7) fully with regard to the gases remaining in the exhaust pipe 105. The controller 8 makes the supply valve 3$j$ and the gate valve 111$b$ in a close state to stop introducing the alkaline gas into the exhaust pipe 105 the second time-lag after from the termination timing of the epitaxial growth layer formation.

As described above, in the epitaxial growth apparatus 101 of the embodiment, the alkaline gas is introduced to the upstream side of the exhaust pipe 105 to react with the raw material gas (DCS gas) and the acidic gas (HCl) included in the processing gas. Therefore, since generation of the oily silane OS is prevented, the cleaning maintenance of the exhaust pipe 105 can be performed in safety. In addition, because it is not necessary to supply the expensive oxidizing gas (ClF3) continuously for a long time, cost and time for the cleaning maintenance of the exhaust pipe 105 are saved and the maintenance property of the epitaxial growth apparatus 101 can be extremely improved.

Further in the epitaxial growth apparatus 101 of the embodiment, the heater unit 108 heats the exhaust pipe 105 and the reaction product of the processing gas and the alkaline gas gasifies by the heating. As a result, the reaction product (NH4Cl) and the other substances (Si fine particles) are enabled to be discharged from the exhaust pipe 105. Accordingly, the cleaning maintenance without diassembling the exhaust pipe 105 can be integrated into an in-line processing. Also in this respect, the maintenance property of the epitaxial growth apparatus 101 can be improved.

In addition, the following modifications may be made in the present embodiment. The alkaline gas is not limited to NH3 gas. Gases other than NH3 gas are applicable in the alkaline gas as long as the gases can react with both of the raw material gas (DCS gas) and the acidic gas (HCl) included in the processing gas to generate reaction products easily gasifying.

The epitaxial growth apparatus 101 may be configured to prevent backflow of gases from the exhaust pipe 105 toward the introducing pipe 111 even though it hardly arises since a pressure in the introducing pipe 111 becomes larger than a pressure in the exhaust pipe 105 when the alkaline gas is introduced from the alkaline gas supply source 3i into the exhaust pipe 105 via the introducing pipe 111. For example, a check valve (not shown) capable of blocking backflow of gases may be inserted in the introducing pipe 111, instead of the gate valve 111b, or in combination with the gate valve 111b.

Further, in the operation of the epitaxial growth apparatus 101, the alkaline gas may be introduced into the exhaust pipe 105 unintermittedly corresponding to plural epitaxial growth layer formations sequentially performed for a plurality of substrates WF in the processing space 2d. For example, the controller 8 can continue unintermitted introducing of the alkaline gas into the exhaust pipe 105, during the formerly processed substrate WF is transferred out from the processing space 2d and another substrate WF to be processed subsequently is transferred into the processing space 2d. In this way, it enables the reactions expressed by formulae (6) and (7) to progress precisely with regard to the gases remaining in the exhaust pipe 105.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:

placing a substrate in a processing chamber of an epitaxial growth apparatus having an exhaust pipe communicated with the processing chamber;

mitigating accumulation of oily silane on the exhaust pipe by introducing an alkaline gas into the exhaust pipe without passing through the processing chamber while forming an epitaxial growth layer on the substrate in the processing chamber, the alkaline gas being introduced into the exhaust pipe by flowing into the exhaust pipe from an introducing pipe that is not communicated with the processing chamber; and scrubbing one or more reaction products at a downstream end of the exhaust pipe using a scrubber inserted into the exhaust pipe on the downstream side, the scrubber being a wet scrubber that includes a fan and is configured to scrub the one or more reaction products by applying water to the one or more reaction products and thereby dissolving the one or more reaction products into the water.

2. The method according to claim 1, further comprising: heating the exhaust pipe by a heating unit, the alkaline gas being introduced into the heated exhaust pipe.

3. The method according to claim 1, wherein the forming of the epitaxial growth layer includes supplying a processing gas in the processing chamber, and the introducing of the alkaline gas is performed before the supplying of the processing gas, during the supplying of the processing gas, and after the supplying of the processing gas.

4. The method according to claim 1, wherein the alkaline gas includes an ammonia gas.

5. The method according to claim 1, wherein the introducing pipe is communicated with an upstream side portion of the exhaust pipe.

6. The method according to claim 1, wherein the epitaxial growth layer being formed on the substrate in the processing chamber while the alkaline gas is being introduced into the exhaust pipe is a silicon layer that is being formed by supplying a silane-based gas to the processing chamber.

7. The method according to claim 1, further comprising: supplying a processing gas from a first gas supply source to the processing chamber via a supply pipe communicated with the processing chamber, and supplying the alkaline gas from a second gas supply source to the introducing pipe.

8. The epitaxial growth method according to claim 7, wherein the supplying of the processing gas from the first gas supply source includes
starting the supplying of the processing gas to the processing chamber while the supplying of the alkaline gas is ongoing, and
terminating the supplying of the processing gas to the processing chamber while the supplying of the alkaline gas is ongoing.

9. The epitaxial growth method according to claim 7, wherein the processing gas includes a raw material gas, a carrier gas, and an acidic gas.

10. The epitaxial growth method according to claim 9, wherein the raw material gas includes a silane-based gas, the carrier gas includes a hydrogen gas, the acidic gas includes a hydrogen chloride gas, and the alkaline gas includes an ammonia gas.

11. The method according to claim 2, wherein the heating of the exhaust pipe by the heating unit further includes heating at least an inner surface of the exhaust pipe.

12. The method according to claim 11, wherein the heating of the exhaust pipe by the heating unit further includes heating the inner surface of the exhaust pipe to a temperature in a range of 200° C. to 400° C.

13. The method according to claim 1, further comprising:
supplying a processing gas to the processing chamber from a first gas supply source via a supply pipe communicated with the processing chamber, and
supplying the alkaline gas to the introducing pipe from a second gas supply source, wherein
the scrubbing of the one or more reaction products at the downstream end of the exhaust pipe further includes that the scrubber removes a gas ingredient by dissolving the gas ingredient in the water, the gas ingredient being generated by causing a reaction product of the processing gas and the alkaline gas to gasify in the exhaust pipe.

14. The method according to claim 1, wherein the scrubbing of the one or more reaction products further includes that the scrubber uses a filter to remove a substance passing through the exhaust pipe by adhering the substance to the filter.

15. The method according to claim 5, wherein the introducing pipe is communicated with the upstream side portion of the exhaust pipe, such that the introducing pipe is communicated with the exhaust pipe upstream from one or more valves provided in the exhaust pipe.

16. The method according to claim 15, wherein the one or more valves include an automatic pressure controller (APC) valve and a gate valve.

* * * * *